United States Patent
Shih et al.

(10) Patent No.: US 7,759,962 B2
(45) Date of Patent: Jul. 20, 2010

(54) METHODOLOGY FOR BIAS TEMPERATURE INSTABILITY TEST

(75) Inventors: Jiaw-Ren Shih, Hsin-Chu (TW); Neeraj Kumar Jha, Baoshan Township (TW); Rakesh Ranjan, Baoshan Township (TW); Naresh Kumar Emani, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 120 days.

(21) Appl. No.: 12/252,904

(22) Filed: Oct. 16, 2008

(65) Prior Publication Data

US 2010/0097091 A1    Apr. 22, 2010

(51) Int. Cl.
*G01R 31/26* (2006.01)
(52) U.S. Cl. ........................ 324/768; 324/765
(58) Field of Classification Search ............... None
See application file for complete search history.

(56) References Cited

U.S. PATENT DOCUMENTS

| | | | |
|---|---|---|---|
| 5,600,578 A * | 2/1997 | Fang et al. | 703/14 |
| 6,822,471 B2 * | 11/2004 | Fleury et al. | 324/765 |
| 7,268,575 B1 | 9/2007 | Chen et al. | |
| 7,271,608 B1 * | 9/2007 | Vermeire et al. | 324/763 |

* cited by examiner

*Primary Examiner*—Minh N Tang
(74) *Attorney, Agent, or Firm*—Slater & Matsil, L.L.P.

(57) ABSTRACT

A method for performing a bias temperature instability test on a device includes performing a first stress on the device. After the first stress, a first measurement is performed to determine a first parameter of the device. After the first measurement, a second stress is performed on the device, wherein only the first parameter is measured between the first stress and the second stress. The method further includes performing a second measurement to determine a second parameter of the device after the second stress. The second parameter is different from the first parameter.

20 Claims, 4 Drawing Sheets

METHODOLOGY FOR BIAS TEMPERATURE INSTABILITY TEST

TECHNICAL FIELD

This invention relates generally to integrated circuits, and more particularly, to the determination of the behavior of integrated circuits under bias temperature instability stress.

BACKGROUND

Reliability-related issues of integrated circuits have existed for decades. In the past, bias temperature instability (BTI, often known for negative bias temperature instability (NBTI) when related to PMOS devices) related issues have had a significant impact on designs of integrated circuits. To predict the behavior and the reliability of integrated circuits, simulation program with integrated circuit emphasis (SPICE) aging models need to be established, which requires BTI tests to be performed in order to collect data from integrated circuit devices.

The most commonly used parameters in the BTI tests are saturation drain current (Idsat) degradation $\Delta$Idsat, linear drain current (Idlin) degradation $\Delta$Idlin, and threshold voltage (Vt) degradation $\Delta$Vt, which are indications as to how devices degrade with high-temperature stress and voltage stress. FIG. 1 illustrates a conventional scheme for measuring one of the parameters, for example, $\Delta$Idsat. The Y-axis represents the BTI degradation, which may be the percentage of the Idsat reduction caused by stresses applied to a device. The X-axis represents the stress time. After each of the stresses, the parameter of interest is measured. It is noted that at the time the parameter is measured, the device recovers partially from the stress (note the drop of the dots), and hence the Idsat degradation $\Delta$Idsat is reduced. Using the method illustrated in FIG. 1, only one parameter, such as Idsat degradation $\Delta$Idsat, can be measured.

To establish the aging model, however, $\Delta$Idsat, $\Delta$Idlin, and $\Delta$Vt are all required. Therefore, all of these three parameters need to be measured, preferably from a same device since the three parameters are highly correlated. FIG. 2 illustrates a second methodology for measuring the three parameters. After a period of stress time, $\Delta$Idsat is measured, followed by the measurement of other parameters. In the illustrated example, an I-V sweep is performed, so that $\Delta$Idlin and $\Delta$Vt can be extracted. However, it is noted that during the time $\Delta$Idsat, $\Delta$Idlin, and $\Delta$Vt are measured, the device continuously recovers from the previous stress. Therefore, the value of $\Delta$Idsat actually represents a different degradation value of the device than the values of $\Delta$Idlin and $\Delta$Vt. For example, at the time $\Delta$Idsat is measured, the device may be degraded by 5 percent, while when $\Delta$Idlin and $\Delta$Vt are measured, the device has recovered to a degradation level of only 4 percent. Therefore, the measured $\Delta$Idsat, $\Delta$Idlin, and $\Delta$Vt values cannot reflect the real correlation between these parameters. The incorrectly reflected correlation will adversely affect the SPICE aging model established from these measurement results.

The results obtained using the method shown in FIG. 2 are shown in FIG. 3, which illustrates $\Delta$Idsat and $\Delta$Idlin as functions of stress time. FIG. 3 reveals several drawbacks in the conventional BTI test methodology. First, it is found that circles, which are measured $\Delta$Idsat values, are greater than the squares, which are measured $\Delta$Idlin values. These results conflict with the practical situation, in which the $\Delta$Idsat values should always be less than the $\Delta$Idlin values. Second, the slope (n) of $\Delta$Idsat is 0.13, which is significantly different from the slope of $\Delta$Idlin (0.17). This also conflicts with the practical situation, in which the slopes of the $\Delta$Idsat values and the $\Delta$Idlin values should be substantially the same.

In FIG. 3, the incorrect result that $\Delta$Idsat values are greater than the $\Delta$Idlin is a consequence of measuring $\Delta$Idsat values before measuring $\Delta$Idlin and $\Delta$Vt values. If, however, $\Delta$Idlin and $\Delta$Vt values are measured before $\Delta$Idsat, $\Delta$Idsat values will be less than the $\Delta$Idlin values. This indicates that the measurement errors have dominated the measurement in the conventional BTI test methodology.

FIG. 4 illustrates threshold voltage degradation $\Delta$Vt as a function of stress time. It is noticed that the extracted slope is 0.217, which is also significantly different from the slopes of $\Delta$Idsat and $\Delta$Idlin. Again, this conflicts with the real situation, in which the slope of $\Delta$Vt should be substantially equal to the slopes of $\Delta$Idsat and $\Delta$Idlin. A new measurement methodology is thus required to overcome the above-discussed problems and provide a more accurate modeling.

SUMMARY OF THE INVENTION

In accordance with one aspect of the present invention, a method for performing a bias temperature instability test on a device includes performing a first stress on the device. After the first stress, a first measurement is performed to determine a first parameter of the device. After the first measurement, a second stress is performed on the device, wherein only the first parameter is measured between the first stress and the second stress. A second measurement is performed to determine a second parameter of the device after the second stress. The second parameter is different from the first parameter.

In accordance with another aspect of the present invention, a method for performing a bias temperature instability test includes providing a device and performing a first stress on the device. After the first stress, a first measurement is performed to determine a first parameter of the device. The first parameter is selected from the group consisting essentially of a saturation current degradation, a linear current degradation, and a threshold voltage degradation. The method further includes, after the first measurement, performing a second stress on the device. After the second stress, a second measurement is performed to determine a second parameter of the device. The second parameter is selected from the group and is different from the first parameter. Throughout an entirety of the bias temperature instability test, no more than one parameter is measured between any two consecutive stresses.

In accordance with yet another aspect of the present invention, a method for performing a bias temperature instability test includes providing a transistor; and performing stresses on the transistor. A saturation current degradation of the transistor between a first pair of consecutive stresses is measured. A linear current degradation of the transistor between a second pair of consecutive stresses is measured. A threshold voltage degradation of the transistor between a third pair of consecutive stresses is measured. Between either of the first, the second, and the third pairs of consecutive stresses, no more than one of the saturation current degradation, the linear current degradation, and the threshold voltage degradation is measured.

The advantageous features of the present invention include reduced stress recovery time in the stress test, so that the correlation between the tested parameters is preserved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel bias temperature instability (BTI) test methodology is provided. In the following discussion, saturation drain current degradation ΔIdsat (also referred to as Idsat degradation hereinafter), linear drain current degradation ΔIdlin (also referred to as Idlin degradation), and threshold voltage degradation ΔVt (also referred to as Vt degradation) are used as examples to explain the concept of the present invention. However, the teaching of the present invention is readily applicable to the measurement of the degradation of other correlated parameters. Also, transistors are used as exemplary test devices, although the embodiments of the present invention can also be applied to the measurement of other types of devices including, but not limited to NMOSFET, High Voltage (HV) devices, and the like.

Figure 1:
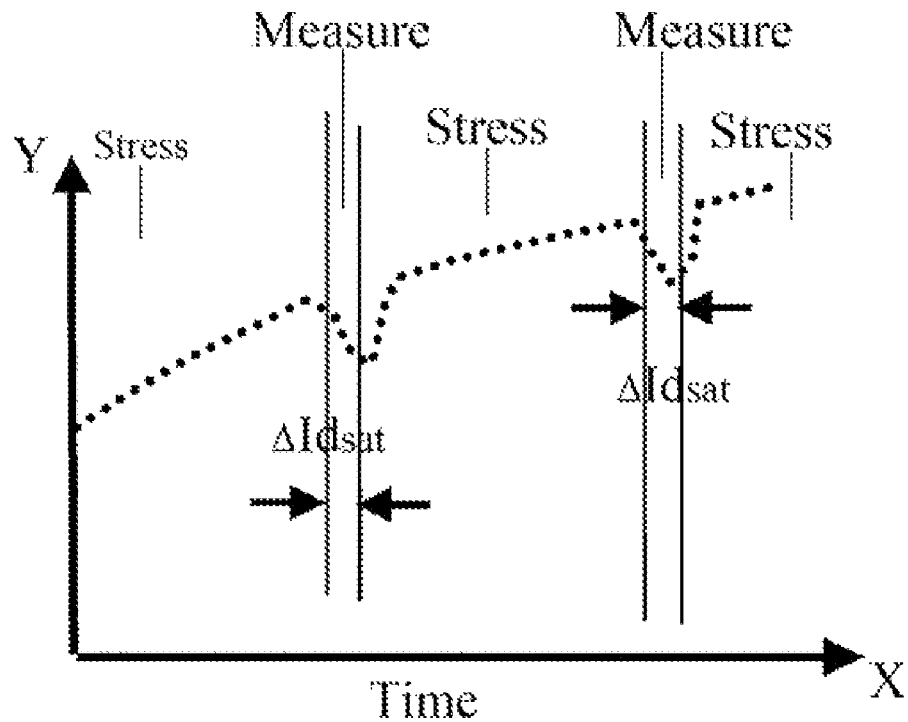
FIG. 1 illustrates a conventional bias temperature instability test scheme, wherein only one parameter is measured.
Figure 2:
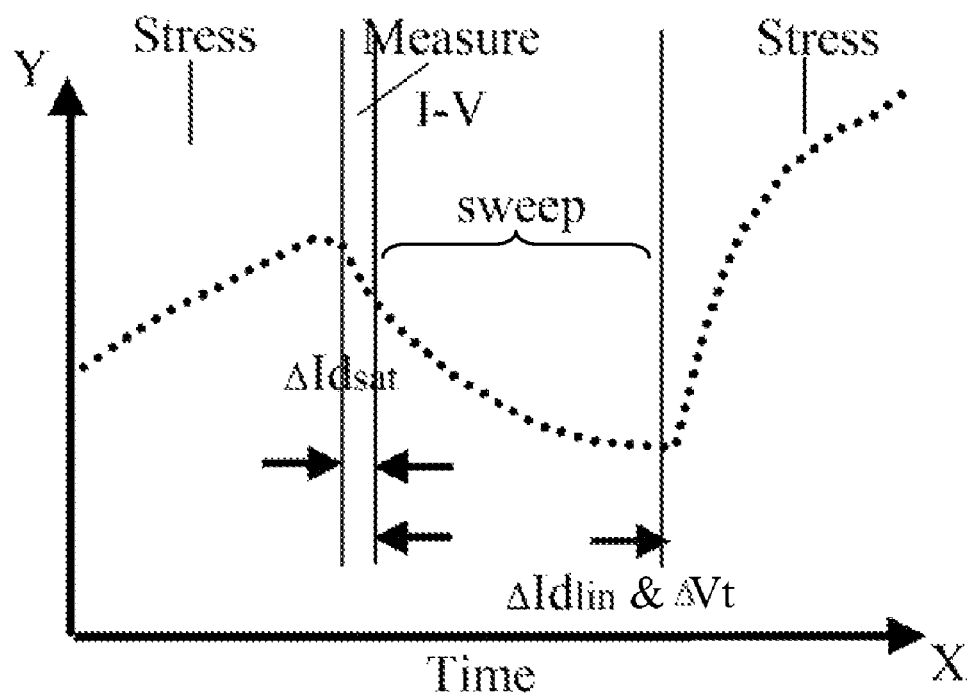
FIG. 2 illustrates another conventional bias temperature instability test scheme, wherein three parameters are measured.
Figure 3:
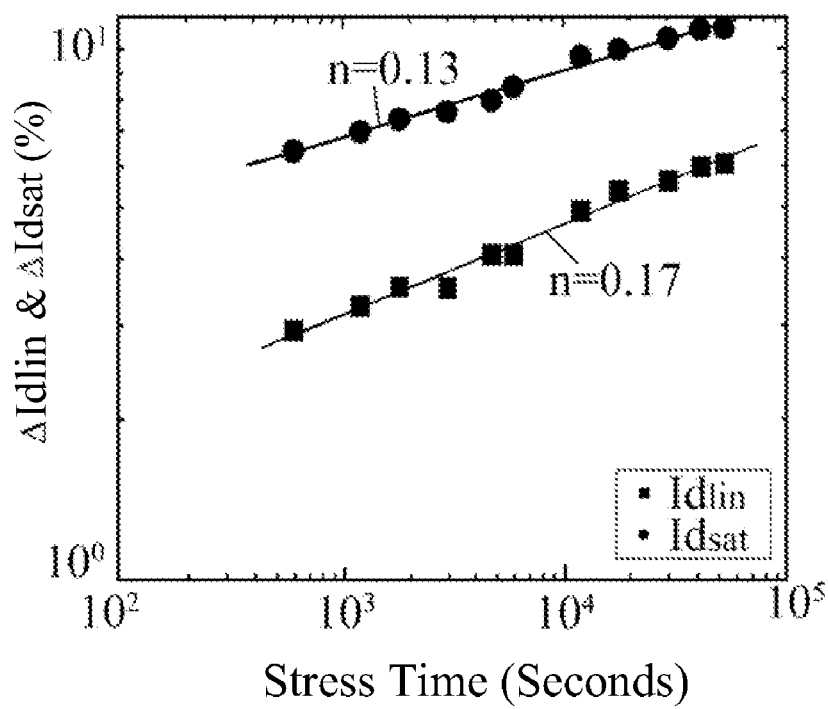
FIGS. 3 and 4 are the results obtained using the test scheme shown in FIG. 2.
Figure 4:
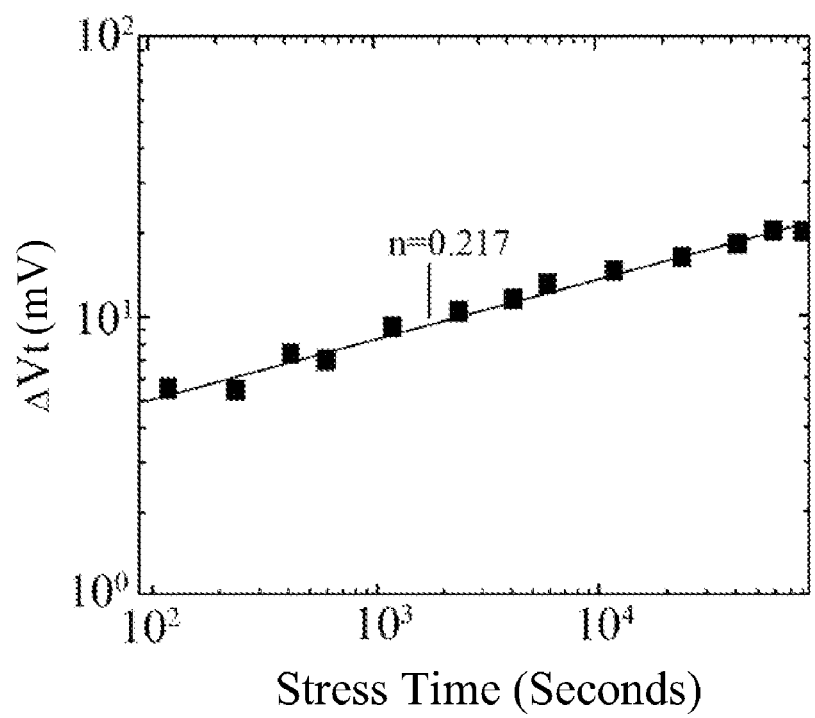
Figure 5:
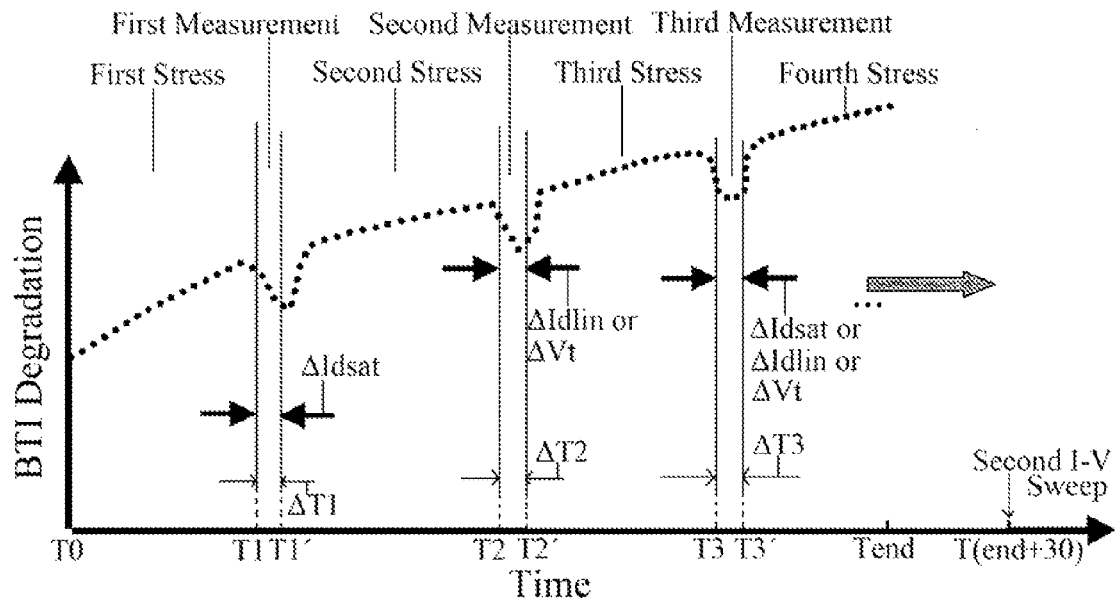
FIG. 5 illustrates an embodiment of the present invention, wherein only one of a plurality of parameters is tested between any two consecutive stresses.

FIG. 5 illustrates an exemplary test scheme of the present invention, wherein BTI degradation is illustrated as a function of time. The test device is a transistor (not shown) having a gate, a drain, and a source. The Y-axis represents the BTI degradation, which may be represented using Idsat degradation ΔIdsat in percentage, Idlin degradation ΔIdlin in percentage, and/or threshold voltage degradation ΔVt in percentage. The X-axis represents time. In an exemplary embodiment, the X-axis is in log scale.

Figure 6:
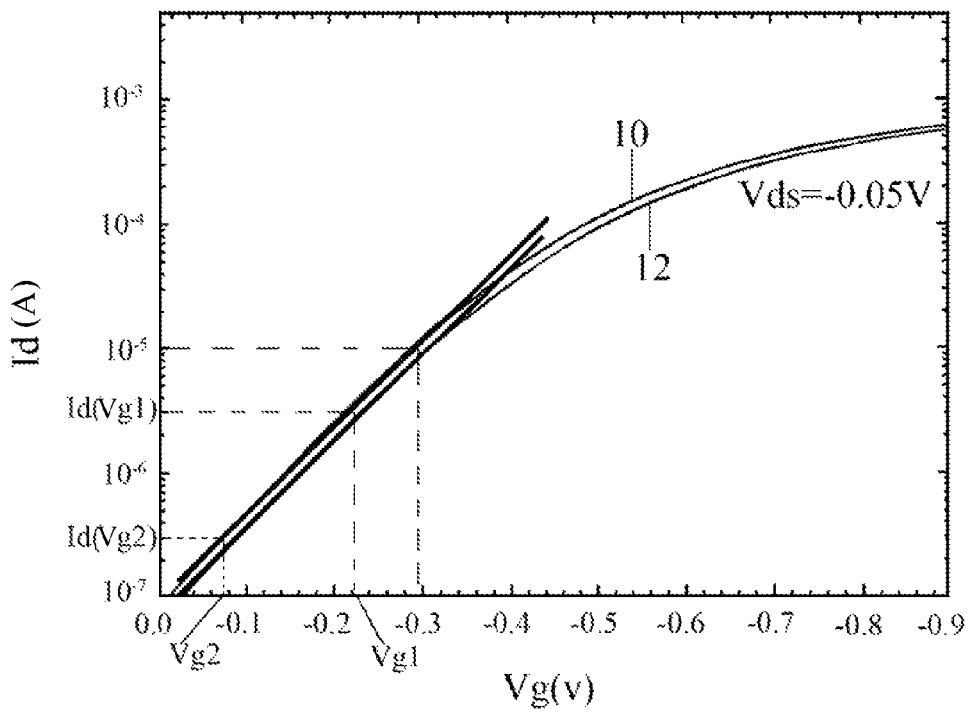
FIG. 6 illustrates exemplary I-V curves obtained before and after stresses, which are used for determining threshold voltage degradation ΔVt.

In the beginning (time T0) of a BTI test, a first I-V sweep is performed. In an embodiment, the first I-V sweep is performed by applying a fixed drain voltage, and sweeping gate voltage from 0V to VCC, so that the corresponding I-V curve is obtained. An exemplary I-V curve is shown in FIG. 6 as line 10. After the first I-V sweep, a first stress is performed, in which the corresponding test device is stressed at an elevated temperature, for example, 125° C. A non-zero gate voltage may be applied to the gate of the test device during the first stress and subsequent stresses of the BTI test. During the first stress and the subsequent stresses, the degradation of the test devices continues, as shown by the increase in the Y-value of the dots.

After the first stress, a first measurement is performed to measure a first parameter, for example, Idsat degradation ΔIdsat, although the first parameter may also be Idlin degradation ΔIdlin or Vt degradation ΔVt. The first measurement starts at time T1 and ends at time T1'. Throughout the description, the terms "measure" and "measurement" are used to refer to the actions for determining ΔIdsat, ΔIdlin, or ΔVt, and may refer to measuring these parameters directly, or determining these parameters by measuring Idsat, Idlin, and Vt, respectively, and calculating ΔIdsat, ΔIdlin, and ΔVt by calculating the differences of these parameters between the currently measured values and the values measured before the stresses. It is realized that during the test time ΔT1, the degradation recovery occurs, as shown by the dropping of the dots in FIG. 5. To reduce the recovery effect, the test time ΔT1, which equals to (T1'-T1), is preferably as short as possible. As is known in the art, the test time ΔT1 is related to the capability of the equipment used for the test, and may be as short as milliseconds. However, longer time may be needed. Since the degree of the recovery is related to the test time ΔT1, only one measurement of one parameter is performed before the second stress, which is started at time T1', so that the test time ΔT1 is shortened. In the illustrated example, only the Idsat degradation ΔIdsat is measured during the first test time ΔT1.

During a second stress, which is also performed at the elevated temperature with a stress voltage applied to the test device, the degradation of the test device continues. At time T2, the second stress is stopped, and a second measurement of a second parameter is performed. In the preferred embodiment of the present invention, the second parameter is different from the first parameter. Accordingly, the second parameter is preferably selected from Idlin degradation ΔIdlin and threshold voltage degradation ΔVt. In alternative embodiments, the first parameter may be measured again at time T2.

Preferably, the second test time ΔT2, which equals (T2-T2') is also as short as possible. More preferably, the second test time ΔT2 is preferably substantially equal to the first time ΔT1. Accordingly, even if there is recovery effect during the second test time ΔT2, the degree of the recovery is similar to the degree of the recovery during the first test time ΔT1. Advantageously, by keeping the degrees of the recovery effect the same between different measurements, the correlation between different parameters can be maintained. Again, only one measurement of one parameter is performed between the second stress and a subsequent third stress.

After the third stress, a third measurement is performed starting at time T3. In an embodiment, the third measurement is performed on a parameter different from the first and the second parameters. In an exemplary embodiment, the first, the second, and the third parameters are Idsat degradation ΔIdsat, Idlin degradation ΔIdlin, and Vt degradation ΔVt, respectively. In other embodiments, the third measurement is performed on one of the first and the second parameters that have already been measured. Again, during the third test time ΔT3, only one of the parameters of interest is measured. The test time ΔT3 is preferably short, and more preferably substantially equal to test times ΔT1 and ΔT2.

After the third measurement, more stresses are performed, followed by more measurements, wherein the above-discussed steps may be repeated. Preferably, throughout the entire BTI test, between any two consecutive stresses, one, and only one, measurement of one of the parameters is performed. For each of the parameters, the measurements are distributed substantially evenly throughout the entire test process. More preferably, two consecutive measurements (although separated by a stress) are preferably (but not required) performed to different parameters. The parameters are thus preferably measured in a round robin pattern.

Some of the possible combinations of measurements are listed as follows. It is realized that by applying the above-discussed concept, more combinations of measurement schemes may be developed. The combinations include, but are not limited to:
1. Stress→ΔIdsat→Stress→ΔIdlin→Stress→ΔVt→Stress→ΔIdsat→Stress→ΔIdlin . . . .
2. Stress→ΔVt→Stress→ΔIdlin→Stress→ΔIdsat→Stress→ΔVt→Stress→ΔIdlin . . . .
3. Stress→ΔIdsat→Stress→ΔIdlin→Stress→ΔIdsat→Stress→ΔIdlin→Stress . . . .
4. Stress→ΔIdsat→Stress→ΔVt→Stress→ΔIdsat→Stress→ΔVt→Stress . . . and
5. Stress→ΔIdlin→Stress→ΔVt→Stress→ΔIdlin→Stress→ΔVt→Stress→ΔIdlin . . . .

After the stress and measurement sequence, at time Tend, the stress and measurement steps are stopped. The temperature is returned to room temperature, and the stress voltage is disconnected from the test device, and hence the recovery occurs. After a period of time that is long enough for the device to stop recovering, for example, 30 minutes after time Tend (indicated as T(end+30)), a second I-V sweep is performed, for example, using essentially a same method as the first I-V sweep performed at time T0. The I-V sweeps performed at time T0 and time T(end+30) may be used for developing correlation of the parameters. In alternative embodiments, the first and the second I-V sweeps are not performed.

In order to ensure that test times ΔT1, ΔT2, ΔT3 are substantially equal to each other, the measurement of all parameters are preferably short enough. Conventionally, threshold voltage degradation ΔVt may be measured by performing an I-V sweep. However, I-V sweeps typically take significantly longer time than measuring Idsat degradation ΔIdsat, and hence the recovery effect caused by the I-V sweeps is greater than the recovery effect caused by measuring Idsat degradation ΔIdsat. An exemplary embodiment for measuring Vt degradation ΔVt is provided below, wherein the measurement may be made in a same period of time as measuring Idsat degradation ΔIdsat.

In the sub-threshold range, the I-V curves are substantially linear, as shown by straight lines in FIG. 6, which are obtained from I-V sweeps. Line 10 is the I-V curve obtained before a stress, and line 12 is obtained after the stress. The sub-threshold swing ss may be defined as:

$$ss=(Vg1-Vg2)/[\log_{10}(Id(Vg1))-\log_{10}(Id(Vg2))] \quad [\text{Eq. 1}]$$

Wherein voltages Vg1 and Vg2 are gate voltages, and currents Id(Vg1) and Id(Vg2) are the drain currents corresponding to gate voltages Vg1 and Vg2, respectively.

The threshold voltage Vt may be defined as the required gate voltage for achieving a pre-specified drain current at a given drain voltage. In an exemplary embodiment, the threshold voltage Vt is defined as the required gate voltage for achieving a drain current of 1 μA/μm at a drain voltage of 50 mV, wherein the drain current is the current per unit gate width. In the exemplary embodiment as shown in FIG. 6, the respective test device has a gate length of about 10 μm. Accordingly, the drain current corresponding to the threshold voltage will be 10 μm*1 μA/μm, which is equal to about 1E-5 amps. It is found from FIG. 6 that the current of 1E-5 amps occurs at a gate voltage of about −0.3 volts (for a PMOS device). Accordingly, the threshold voltage at any given stress time t may be calculated as:

$$\Delta Vt(t)=[\log_{10}(Id(0)/Id(t))]*ss \quad [\text{Eq. 2}]$$

Wherein ΔVt(t) is the threshold voltage degradation ΔVt at time t, Id(0) is the drain current measured before stress, and Id(t) is the drain current measured at stress time t. Therefore, by using Equations 1 and 2, the threshold voltage degradation ΔVt may be obtained by measuring the drain current at time t with the gate voltage equal to −0.3V. Accordingly, the threshold voltage degradation ΔVt can be measured without resorting to I-V sweeps.

Figure 7:
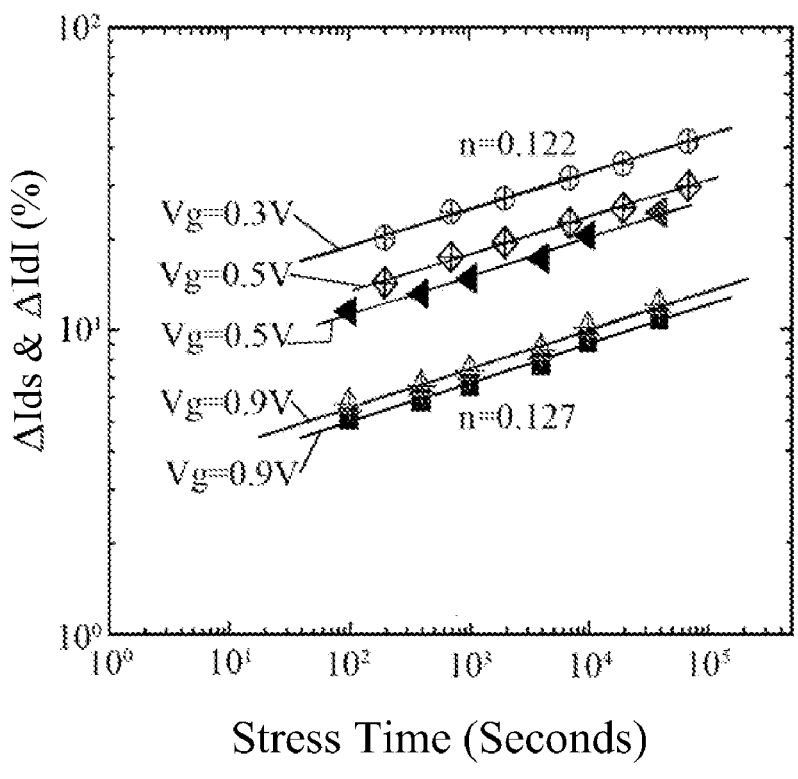
FIGS. 7 and 8 are the results obtained using the test scheme shown in FIG. 5.

FIG. 7 illustrates the results obtained from the embodiments of the present invention, wherein Idsat degradation ΔIdsat and Idlin degradation ΔIdlin are shown as functions of stress time. Solid points indicate ΔIdsat results, while hollow points indicate ΔIdlin results. The corresponding gate voltages for obtaining these results are also marked in FIG. 7. Several facts may be observed from FIG. 7. First, for each of the gate voltages, the corresponding ΔIdlin fit-line is always higher than the ΔIdsat fit-line. This observation is in-line with the practical situations in which the ΔIdlin values should always be greater than the ΔIdsat values. Second, regardless of the values of the gate voltage, the slopes (n) of ΔIdsat values and ΔIdlin values are very close, ranging from about 0.120 to about 0.130.

Figure 8:
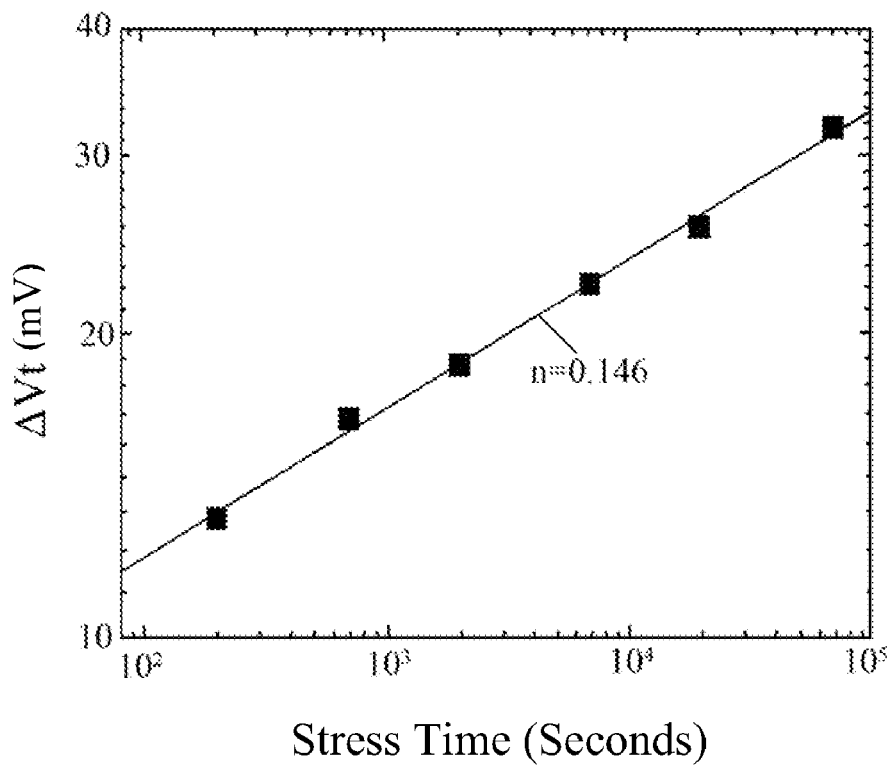

FIG. 8 illustrates the threshold voltage degradation ΔVt as a function of stress time. It is noted that the slope (n) is about 0.146, which is much closer to the slopes of ΔIdsat and ΔIdlin than the slopes measured using conventional schemes.

The embodiments of the present invention have several advantageous features. First, by measuring only one parameter at a time, and hence shortening the time of measurement, the recovery effect is significantly reduced, and the measured degradation results are more accurate. Second, with the degrees of recoveries being kept the same for different parameters, the correlation between the different parameters is reflected more accurately by the measurement results. A more accurate SPICE aging model can thus be established.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for performing a bias temperature instability test, the method comprising:
   providing a device;
   performing a first stress on the device;
   after the first stress, performing a first measurement to determine a first parameter of the device;

after the first measurement, performing a second stress on the device, wherein only the first parameter is measured between the first stress and the second stress; and after the second stress, performing a second measurement to determine a second parameter of the device, wherein the second parameter is different from the first parameter.

2. The method of claim 1 further comprising:

after the second measurement, performing a third stress on the device, wherein only the second parameter is measured between the second stress and the third stress.

3. The method of claim 2 further comprising:

after the third stress, performing a third measurement on the device, wherein the third measurement is performed to determine a parameter selected from the group consisting essentially of the first parameter and a third parameter different from the first parameter and the second parameter.

4. The method of claim 3, wherein the third measurement is performed to determine the third parameter, and wherein the method further comprises, after the third measurement, performing a fourth stress, wherein only the third parameter is measured between the third stress and the fourth stress.

5. The method of claim 1, wherein the first measurement and the second measurement take substantially a same period of time.

6. The method of claim 1 further comprising repeating steps from the step of performing the first stress to the step of performing the second measurement.

7. The method of claim 1, wherein throughout an entire period of the bias temperature instability test, no more than one parameter is measured between any two consecutive stresses.

8. The method of claim 1 further comprising:

before the step of performing the first stress, performing a first I-V sweep;

after a last stress, waiting a period of time with no stress being performed during the period of time; and performing a second I-V sweep.

9. The method of claim 1, wherein the first parameter and the second parameter are selected from the group consisting essentially of a saturation current degradation, a linear current degradation, and a threshold voltage degradation.

10. A method for performing a bias temperature instability test, the method comprising:

providing a device;

performing a first stress on the device;

after the first stress, performing a first measurement to determine a first parameter of the device, wherein the first parameter is selected from the group consisting essentially of a saturation current degradation, a linear current degradation, and a threshold voltage degradation;

after the first measurement, performing a second stress on the device; and after the second stress, performing a second measurement to determine a second parameter of the device, wherein the second parameter is selected from the group and is different from the first parameter, and wherein throughout an entirety of the bias temperature instability test, no more than one parameter is measured between any two consecutive stresses.

11. The method of claim 10 further comprising:

immediately after the second measurement, performing a third stress on the device; and immediately after the third stress, performing a third measurement on the device, wherein the third measurement is performed to determine the first parameter.

12. The method of claim 10 further comprising:

immediately after the second measurement, performing a third stress on the device; and immediately after the third stress, performing a third measurement on the device, wherein the third measurement is performed to determine a third parameter different from the first parameter and the second parameter, and wherein the third parameter is selected from the group.

13. The method of claim 12, wherein the first, the second, and the third measurements take substantially a same length of time.

14. The method of claim 10 further comprising:

before the step of performing the first stress, performing a first I-V sweep;

after a last stress, waiting a period of time with no stress being performed during the period of time; and performing a second I-V sweep.

15. A method for performing a bias temperature instability test, the method comprising:

providing a transistor;

performing stresses on the transistor;

measuring a saturation current degradation of the transistor between a first pair of consecutive stresses;

measuring a linear current degradation of the transistor between a second pair of consecutive stresses; and measuring a threshold voltage degradation of the transistor between a third pair of consecutive stresses, wherein between either of the first, the second, and the third pairs of consecutive stresses, no more than one of the saturation current degradation, the linear current degradation, and the threshold voltage degradation is measured.

16. The method of claim 15, wherein the step of measuring the saturation current degradation comprises:

measuring a saturation current; and determining the saturation current degradation from the saturation current.

17. The method of claim 15, wherein a first interval between the first pair of consecutive stresses, a second interval between the second pair of consecutive stresses, and a third interval between the third pair of consecutive stresses are substantially equal to each other.

18. The method of claim 15 further comprising repeating the step of measuring the saturation current degradation, the step of measuring the linear current degradation, and the step of measuring the threshold voltage degradation in a round robin pattern.

19. The method of claim 15 further comprising:

performing a first I-V sweep to the transistor;

starting a first one of the stresses;

waiting a period of grace time, wherein during the period of grace time, no stress and no measurement is performed; and performing a second I-V sweep to the transistor.

20. The method of claim 19, wherein during an entire period between the first and the second I-V sweeps, no more than one of the saturation current degradation, the linear current degradation, and the threshold voltage degradation is measured between any two consecutive ones of the stresses.

* * * * *